United States Patent
Anderson et al.

(10) Patent No.: US 10,424,516 B2
(45) Date of Patent: Sep. 24, 2019

(54) INTEGRATING A PLANAR FIELD EFFECT TRANSISTOR (FET) WITH A VERTICAL FET

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/938,860

(22) Filed: Mar. 28, 2018

(65) Prior Publication Data

US 2018/0218948 A1 Aug. 2, 2018

Related U.S. Application Data

(63) Continuation of application No. 15/289,024, filed on Oct. 7, 2016, now Pat. No. 9,991,170, which is a
(Continued)

(51) Int. Cl.
*H01L 21/82* (2006.01)
*H01L 21/8234* (2006.01)
(Continued)

(52) U.S. Cl.
CPC .... *H01L 21/823456* (2013.01); *H01L 21/265* (2013.01); *H01L 21/28518* (2013.01);
(Continued)

(58) Field of Classification Search
None
See application file for complete search history.

(56) References Cited

U.S. PATENT DOCUMENTS 5,060,029 A 10/1991 Nishizawa et al.
5,073,519 A 12/1991 Rodder
(Continued)

OTHER PUBLICATIONS

List of IBM Patents or Patent Applications Treated As Related: Anderson, Brent A., Serial No. 12-16-2015, Filed Dec. 16, 2015, U.S. Appl. No. 15/212,131, filed Jul. 15, 2016, U.S. Appl. No. 15/289,024, filed Oct. 7, 2016.
(Continued)

*Primary Examiner* — Evren Seven
(74) *Attorney, Agent, or Firm* — Sherman IP LLP; Kenneth L. Sherman; Hemavathy Perumal

(57) ABSTRACT

One embodiment provides a method of integrating a planar field-effect transistor (FET) with a vertical FET. The method comprises masking and etching a semiconductor of the vertical FET to form a fin, and providing additional masking, additional etching, doping and depositions to isolate a bottom source/drain (S/D) region. A dielectric is formed on the bottom S/D region to form a spacer. The method further comprises depositing gate metals, etching a vertical gate for the vertical FET and a planar gate for the planar FET using a shared gate mask, depositing dielectric, etching the dielectric to expose one or more portions of the fin, growing epitaxy on a top S/D region, masking and etching S/D contact openings for the bottom S/D region, forming silicide regions in S/D regions, depositing contact metal in the silicide regions to form contacts, and planarizing the contacts.

8 Claims, 6 Drawing Sheets

Related U.S. Application Data continuation of application No. 14/971,105, filed on Dec. 16, 2015, now Pat. No. 9,502,407.

(51) Int. Cl.

| | | |
|---|---|---|
| *H01L 27/088* | (2006.01) | |
| *H01L 29/78* | (2006.01) | |
| *H01L 21/265* | (2006.01) | |
| *H01L 21/306* | (2006.01) | |
| *H01L 21/308* | (2006.01) | |
| *H01L 21/768* | (2006.01) | |
| *H01L 29/66* | (2006.01) | |
| *H01L 21/285* | (2006.01) | |
| *H01L 23/535* | (2006.01) | |
| *H01L 29/423* | (2006.01) | |
| *H01L 29/786* | (2006.01) | |

(52) U.S. Cl.
CPC .... *H01L 21/3085* (2013.01); *H01L 21/30604* (2013.01); *H01L 21/76895* (2013.01); *H01L 21/823412* (2013.01); *H01L 21/823418* (2013.01); *H01L 21/823437* (2013.01); *H01L 21/823475* (2013.01); *H01L 21/823487* (2013.01); *H01L 23/535* (2013.01); *H01L 27/088* (2013.01); *H01L 29/42392* (2013.01); *H01L 29/665* (2013.01); *H01L 29/66666* (2013.01); *H01L 29/78* (2013.01); *H01L 29/7827* (2013.01); *H01L 29/78618* (2013.01); *H01L 29/78642* (2013.01); *H01L 29/78696* (2013.01)

(56) References Cited

U.S. PATENT DOCUMENTS

| | | |
|---|---|---|
| 5,078,498 A | 1/1992 | Kadakia et al. |
| 5,598,367 A | 1/1997 | Noble |
| 5,930,619 A | 7/1999 | Noble |
| 5,932,908 A | 8/1999 | Noble |
| 6,518,622 B1 | 2/2003 | Chew |
| 6,707,089 B2 | 3/2004 | Kim et al. |
| 6,970,372 B1 | 11/2005 | Furukawa et al. |
| 6,998,306 B2 | 2/2006 | Kim et al. |
| 7,148,522 B2 | 12/2006 | Quek et al. |
| 7,282,761 B2 | 10/2007 | Ahn |
| 7,351,227 B2 | 4/2008 | Ng |
| 7,364,997 B2 | 4/2008 | Juengling |
| 7,488,648 B2 | 2/2009 | Baik |
| 7,879,660 B2 | 2/2011 | Booth et al. |
| 7,977,725 B2 | 7/2011 | Yoon et al. |
| 8,035,126 B2 | 10/2011 | Nguyen et al. |
| 9,000,409 B2 | 4/2015 | Huo et al. |
| 9,087,922 B2 | 7/2015 | Sun et al. |
| 9,148,092 B1 | 9/2015 | Brown et al. |
| 9,245,885 B1 | 1/2016 | Xie |
| 2004/0159853 A1 | 8/2004 | Nemati et al. |
| 2008/0315300 A1 | 12/2008 | Higashino |
| 2009/0224339 A1 | 9/2009 | Gogoi et al. |
| 2010/0203695 A1 | 8/2010 | Oh et al. |
| 2012/0248529 A1 | 10/2012 | Liu et al. |
| 2012/0292688 A1 | 11/2012 | Kwon |
| 2014/0015047 A1* | 1/2014 | Ng .............. H01L 21/82385 257/334 |

OTHER PUBLICATIONS

Mutschler, A. Steffora, "A Balancing Act", Semiconductor Engineering, Mar. 14, 2013, pp. 1-7, downloaded from http://semiengineering.com/a-balancing-act/, United States.

List of IBM Patents or Patent Applications Treated as Related: Anderson, Brent A., U.S. Appl. No. 16/457,645, filed Jun. 28, 2019.

\* cited by examiner

INTEGRATING A PLANAR FIELD EFFECT TRANSISTOR (FET) WITH A VERTICAL FET

The present invention generally relates to semiconductor field effect transistors (FETs), and more particularly, an integration scheme that optimizes integration of a planar FET with a vertical FET.

BACKGROUND

Vertical FETs are optimized for logic and memory devices and have short gates. By comparison, planar FETs are optimized for I/O devices and have long gates that allow for increased current density, improved thermal characteristics, etc. As vertical FETs have minimal room for long gates, vertical FETs are not optimized for I/O devices.

SUMMARY

One embodiment provides a method of integrating a planar field-effect transistor (FET) with a vertical FET. The method comprises masking and etching a semiconductor of the vertical FET to form a fin, and providing additional masking, additional etching, doping and depositions to isolate a bottom source/drain (S/D) region. A dielectric is formed on the bottom S/D region to form a spacer. The method further comprises etching back the fin to expose one or more vertical sections of the fin, depositing gate dielectric, depositing gate metals, etching a vertical gate for the vertical FET and a planar gate for the planar FET using a shared gate mask, depositing dielectric, etching the dielectric to expose one or more portions of the fin, growing epitaxy on a top S/D region, masking and etching S/D contact openings for the bottom S/D region, forming silicide regions in S/D regions, depositing contact metal in the silicide regions to form contacts, and planarizing the contacts.

Another embodiment provides a semiconductor structure comprising a vertical field-effect transistor (FET). The vertical FET comprises a bottom source/drain (S/D) region, a spacer on the bottom S/D region, a vertical gate, a fin, a top S/D region including an epitaxy layer, and multiple contacts including a first S/D contact for the bottom S/D region, a second S/D contact for the top S/D region, and a gate contact for the vertical gate. The semiconductor structure further comprises a planar FET comprising an active region including a source region and a drain region, a high voltage gate dielectric, and a planar gate. The planar FET is integrated with the vertical FET.

These and other aspects, features and advantages of the invention will be understood with reference to the drawing figures, and detailed description herein, and will be realized by means of the various elements and combinations particularly pointed out in the appended claims. It is to be understood that both the foregoing general description and the following brief description of the drawings and detailed description of the invention are exemplary and explanatory of preferred embodiments of the invention, and are not restrictive of the invention, as claimed.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention generally relates to semiconductor field effect transistors (FinFETs), and more particularly, an integration scheme that optimizes integration of a planar FET with a vertical FET. One embodiment provides a method of integrating a planar field-effect transistor (FET) with a vertical FET. The method comprises masking and etching a semiconductor of the vertical FET to form a fin, and providing additional masking, additional etching, doping and depositions to isolate a bottom source/drain (S/D) region. A dielectric is formed on the bottom S/D region to form a spacer. The method further comprises etching back the fin to expose one or more vertical sections of the fin, depositing gate dielectric, depositing gate metals, etching a vertical gate for the vertical FET and a planar gate for the planar FET using a shared gate mask, depositing dielectric, etching the dielectric to expose one or more portions of the fin, growing epitaxy on a top S/D region, masking and etching S/D contact openings for the bottom S/D region, forming silicide regions in S/D regions, depositing contact metal in the silicide regions to form contacts, and planarizing the contacts.

Another embodiment provides a semiconductor structure comprising a vertical field-effect transistor (FET). The vertical FET comprises a bottom source/drain (S/D) region, a spacer on the bottom S/D region, a vertical gate, a fin, a top S/D region including an epitaxy layer, and multiple contacts including a first S/D contact for the bottom S/D region, a second S/D contact for the top S/D region, and a gate contact for the vertical gate. The semiconductor structure further comprises a planar FET comprising an active region including a source region and a drain region, a high voltage gate dielectric, and a planar gate. The planar FET is integrated with the vertical FET.

In this specification, the term "vertical region" is used to generally denote a vertical spatial region of a vertical FET. The term "planar region" is used to generally denote a horizontal spatial region of a planar FET. The term "vertical gate" is used to generally denote a gate for a vertical FET. The term "planar gate" is used to generally denote a gate for a planar FET.

Figure 1:
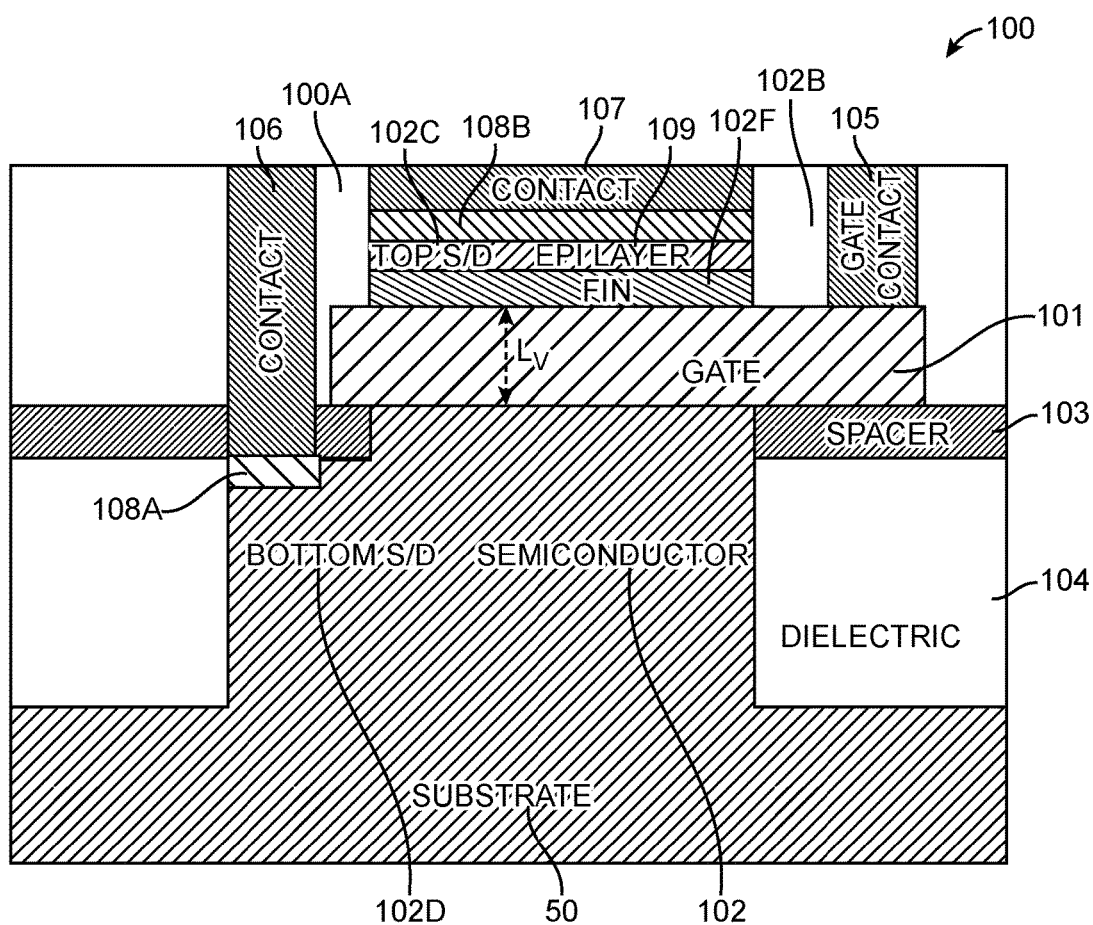
FIG. 1 illustrates a cross-sectional view of a semiconductor vertical FET structure 100.

FIG. 1 illustrates a cross-sectional view of a semiconductor vertical FET structure 100. The vertical FET structure 100 is fabricated on a semiconductor substrate 50. The vertical FET structure 100 comprises a silicon semiconductor 102. A bottom source/drain (S/D) region 102D may be isolated from the substrate 50 using a semiconductor-on-insulator (SOI) or a bulk substrate with one or more implants. If the substrate 50 is a bulk substrate, as shown in FIG. 1, one or more implants are used to isolate the bottom S/D region 102D from the substrate 50. If a SOI is used instead, an example thickness for the SOI is about 30 nm. An anisotropic etch process, such as reactive ion etching (RIE), is applied to the semiconductor 102 to form a fin 102F.

The vertical FET structure 100 may further comprise an optional dielectric layer 104. The semiconductor 102 extends vertically on the dielectric layer 104. The dielectric layer 104 may comprise a dielectric material (e.g., oxide, nitride, oxynitride, high-k, etc.) or a combination of different dielectric materials. The dielectric layer 104 may be formed in different ways, such as using a SOI, using a bulk substrate together with another technique (e.g., silicon-on-nothing), etc.

The vertical FET structure 100 further comprises a gate 101 that is perpendicular to the semiconductor 102. The gate 101 extends across the semiconductor 102 and wraps around opposing sides 100A and 102B of a vertical region of the vertical FET structure 100. The gate 101 acts as a conductor. The vertical FET structure 100 further comprises a gate contact 105 for the gate 101.

Let $L_V$ denote a dimension (e.g., length or thickness) of the gate 101.

The fin 102F overlaps a top source/drain (S/D) region 102C. After epitaxial deposition (i.e., epitaxial crystal growth), the fin 102F acts as a channel, connecting epitaxy ("epi layer") 109 deposited in the top S/D 102C region to the bottom S/D region 102D.

The vertical FET structure 100 further comprises a bottom spacer 103 positioned above the bottom S/D region 102D. The spacer 103 may comprise a dielectric material. The spacer 103 may be formed by a deposition and an anisotropic etch process, such as reactive ion etching (RIE) process or wet etching. A gate mask is required for the gate contact 105 during the RIE process.

Silicide is formed in the S/D regions. For example, as shown in FIG. 1, silicide regions 108A and 108B are formed in the bottom S/D region 102D and the top S/D region 102C, respectively. Contact metal is deposited in the silicide regions 108A and 108B to form a first S/D contact 106 for the bottom S/D region 102D and a second S/D contact 107 for the top S/D region 102C, respectively.

Embodiments of the invention provide an integration scheme that optimizes integration of a planar FET with a vertical FET with optimal integration costs and complexity. In one embodiment, most steps of a process flow for a vertical FET are shared with a process flow for a planar FET, and key features are kept co-planar to improve process control and reduce cost. A planar FET with a vertical FET is optimized for memory and logic devices, as well as I/O devices.

Figure 2:
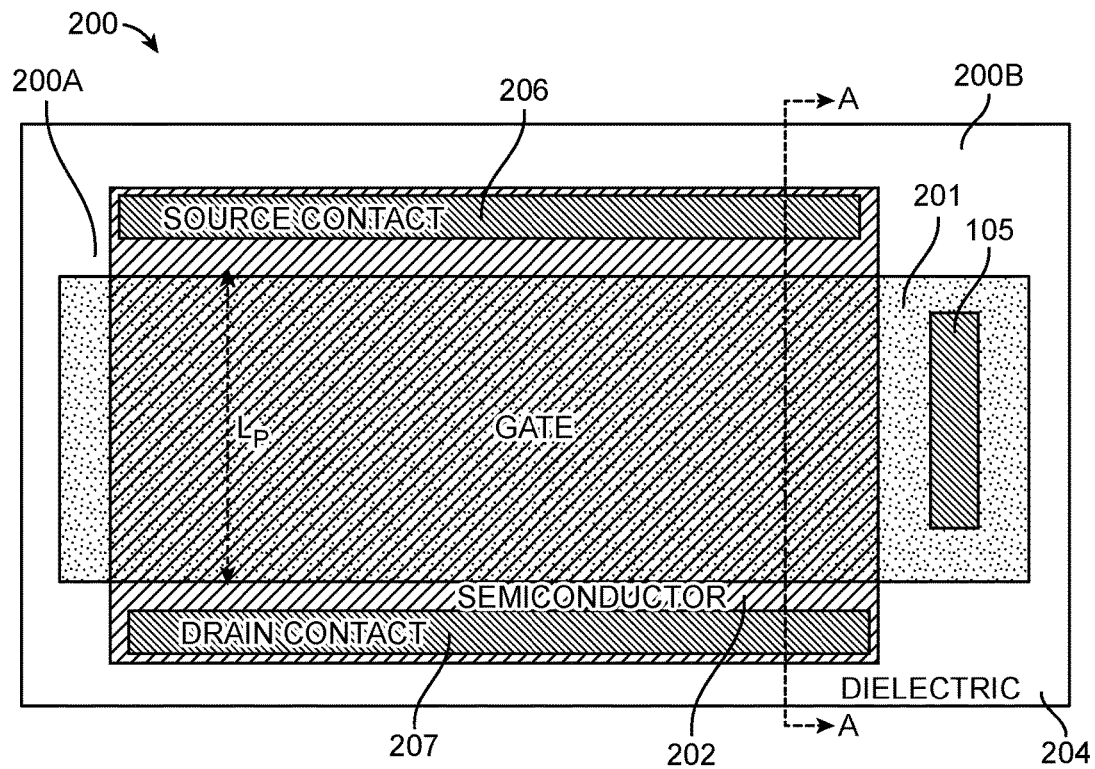
FIG. 2 illustrates a top-down view of a semiconductor planar FET structure 200 integrated with the vertical FET structure 100, in accordance with an embodiment.
Figure 3:
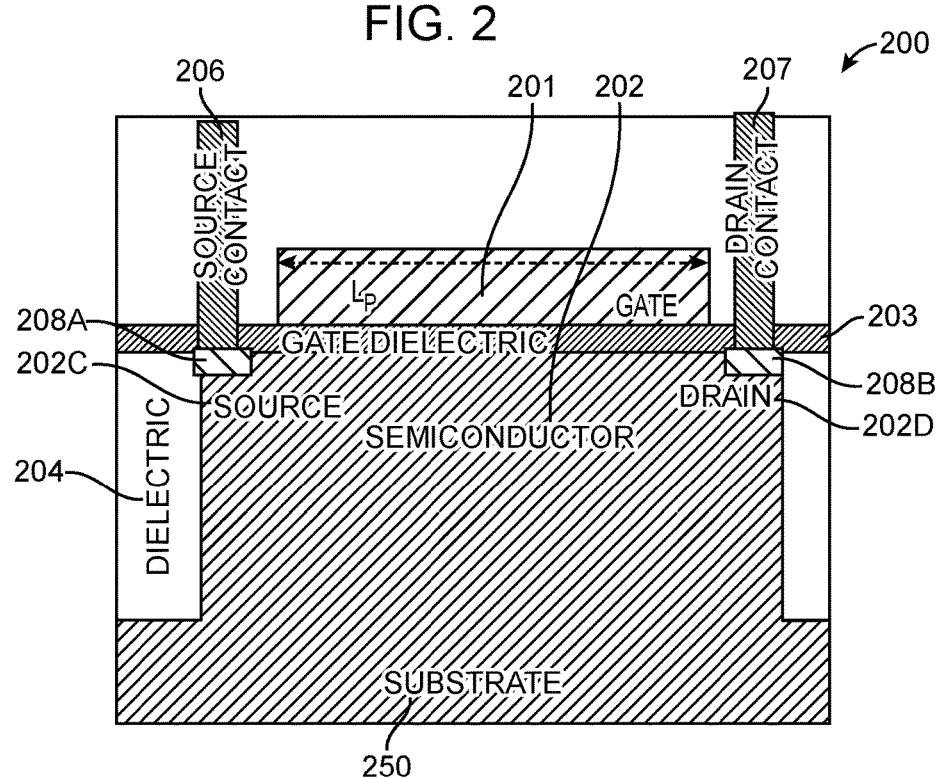
FIG. 3 illustrates a cross-sectional view of the planar FET structure 200 along lines A-A of FIG. 2, in accordance with an embodiment.

FIG. 2 illustrates a top-down view of a semiconductor planar FET structure 200 integrated with the vertical FET structure 100, in accordance with an embodiment. FIG. 3 illustrates a cross-sectional view of the planar FET structure 200 along lines A-A of FIG. 2, in accordance with an embodiment. The planar FET structure 200 is fabricated on a semiconductor substrate 250. A silicon semiconductor 202 extends horizontally on a dielectric layer 204. A source region 202C and a drain region 202D may be isolated from the substrate 250 using a semiconductor-on-insulator (SOI) or a bulk substrate with one or more implants. If the substrate 250 is a bulk substrate, as shown in FIG. 3, one or more implants are used to isolate the source and drain regions 202C and 202D from the substrate 250. The dielectric layer 204 may comprise a dielectric material (e.g., oxide, nitride, oxynitride, high-k, etc.) or a combination of different dielect materials. The dielectric layer 204 may be formed in different ways, such as using a SOI, using a bulk substrate together with another technique (e.g., silicon-on-nothing), etc.

The planar FET structure 200 further comprises a gate 201 that is perpendicular to the semiconductor 202. The gate 201 extends across the semiconductor 202 and extends past opposing sides 200A and 200B of a planar region of the planar FET structure 200. The gate 201 acts as a conductor. The semiconductor 202 is isolated/separated from the gate 201 by a thicker high voltage gate dielectric layer ("gate dielectric") 203 The gate dielectric 203 may be about 20-60 A. Total dielectric thickness in the planar region (for high voltage I/O) is greater than total dielectric thickness of the vertical FET structure 100 in the vertical region.

Let $L_P$ denote a dimension (e.g., length) of the gate 201. The gate 101 of the vertical FET structure 100 is shorter/narrower than the gate 201 (i.e., $L_P > L_V$). The gate 101 has a "short gate length" and the gate 201 has a "long gate length". For example, $L_P$ may be greater than 100 nm, and $L_V$ may be about 20 nm. The planar FET structure 200 is an example long-channel FET device.

Silicide is formed in the S/D regions. For example, as shown in FIG. 3, silicide regions 208A and 208B are formed in the source region 202C and the drain region 202D, respectively. Contact metal is deposited in the silicide regions 208A and 208B to form a first S/D contact 206 for the source region 202C and a second S/D contact 207 for the drain region 202D, respectively.

As shown in FIGS. 1-3, the planar and vertical FETs share silicide regions, S/D contacts and the gate contact 105.

The planar region may have optional epitaxy in the S/D regions to provide low resistance between the contacts and the channel region.

Embodiments of the invention provide modifications to a process flow for a vertical FET to enable adding/integrating a planar FET to the vertical FET (i.e., building a long-channel FET device on a vertical FET device). The modifications provide a simple means of integrating a long gate length device into a short gate length device.

In one embodiment, modifications to the process flow for the vertical FET device involve removing the spacer 103 in the planar region, and forming a separate, planar-specific gate dielectric 203 in the planar region. In another embodiment, modifications to the process flow for the vertical FET involve masking the spacer 103 in the planar region, and re-using the spacer 103 as a gate dielectric 203 for the planar region.

In one embodiment, modifications to the process flow for the vertical FET involve special implants for the planar FET.

Figure 4:
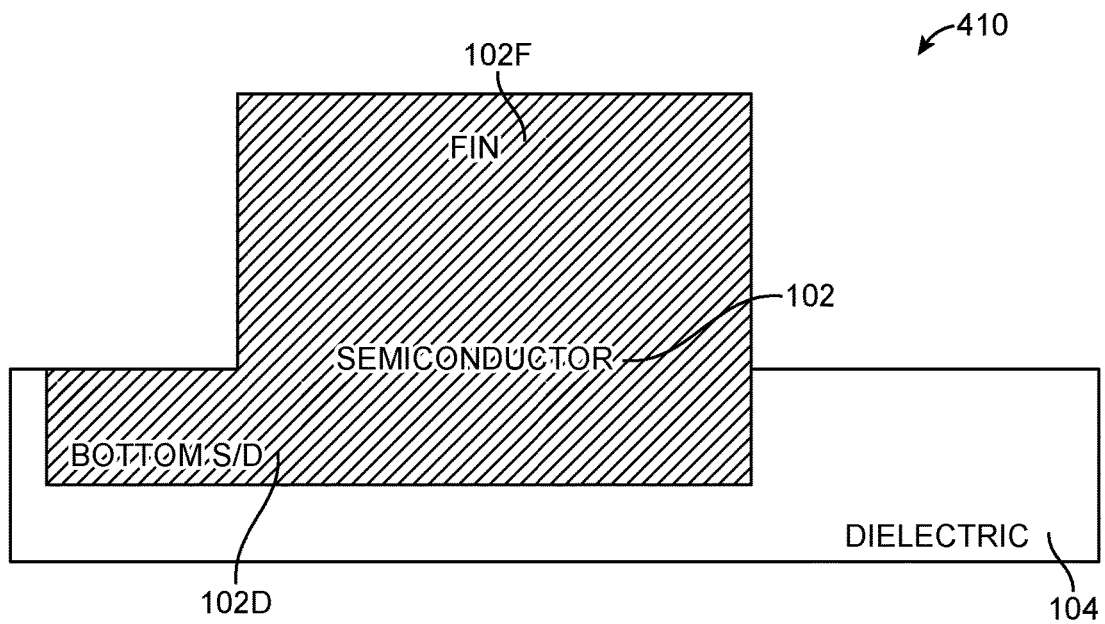
FIG. 4 illustrates an example vertical region 410, in accordance with an embodiment.

The following discussion illustrates modifications to a process flow for a vertical FET. FIG. 4 illustrates an example vertical region 410, in accordance with an embodiment. An anisotropic etch process, such as reactive ion etching (RIE), is applied to the semiconductor 102 to form the fin 102F and isolate the bottom S/D region 102D. There is no fin masking in the planar region. The bottom S/D region 102D is implanted in the vertical and planar regions, such that the planar region shares bottom S/D region definition with the vertical region.

Figure 5:
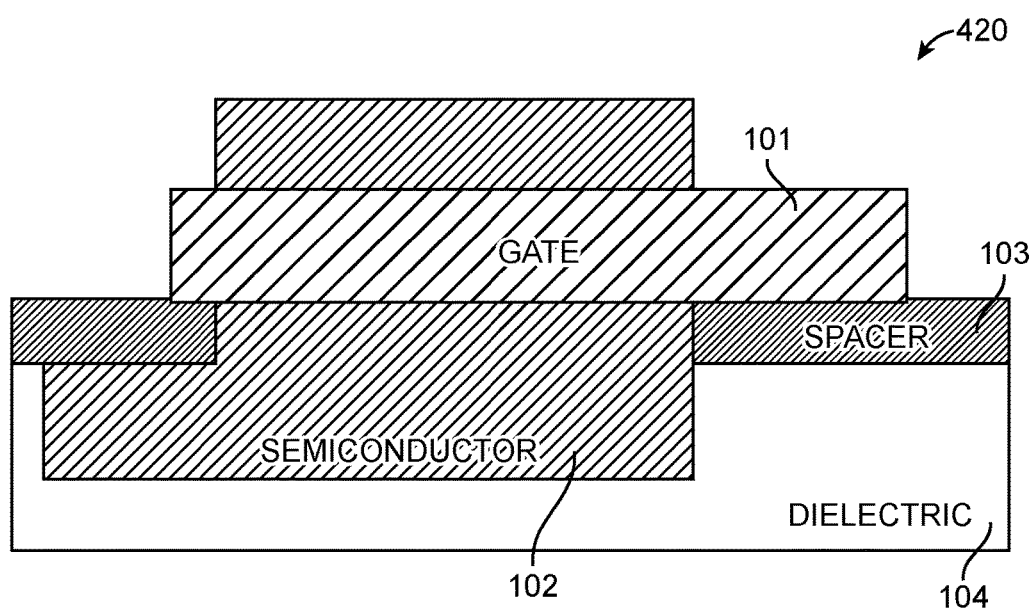
FIG. 5 illustrates an example vertical region 420 with a gate 101, in accordance with an embodiment.

FIG. 5 illustrates an example vertical region 420 with a gate 101, in accordance with an embodiment. Dielectric is deposited on the bottom S/D region 102D to form the bottom spacer 103. The spacer 103 may be formed by an anisotropic etch process, such as reactive ion etching (RIE) process. The spacer 103 in the planar region is either masked (for re-use as a gate dielectric for the planar region) or removed (to form a separate, planar-specific gate dielectric for the planar region).

Lateral pullback is applied to the fin 102F to expose vertical sections of the fin 102F. Uniformed masking and etching strategy is used to create vertical and planar gates. Specifically, the vertical region and the planar region share a vertical and planar gate mask required for the gate contact 105 during the RIE process. Gate metals are deposited, and the gate 101 is etched using the shared gate mask to produce the vertical region 420.

Figure 6:
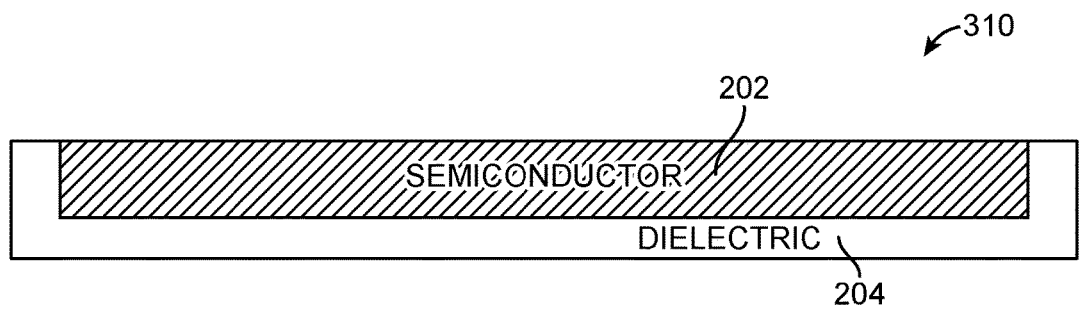
FIG. 6 illustrates an example planar region 310, in accordance with an embodiment.

The following discussion illustrates a process flow for adding/integrating a planar FET to a vertical FET. FIG. 6 illustrates an example planar region 310, in accordance with an embodiment. An anisotropic etch process, such as reactive ion etching (RIE), is applied to etch the bottom S/D region 102D to form the flat, planar region 310. There is no fin masking in the planar region.

Figure 7:
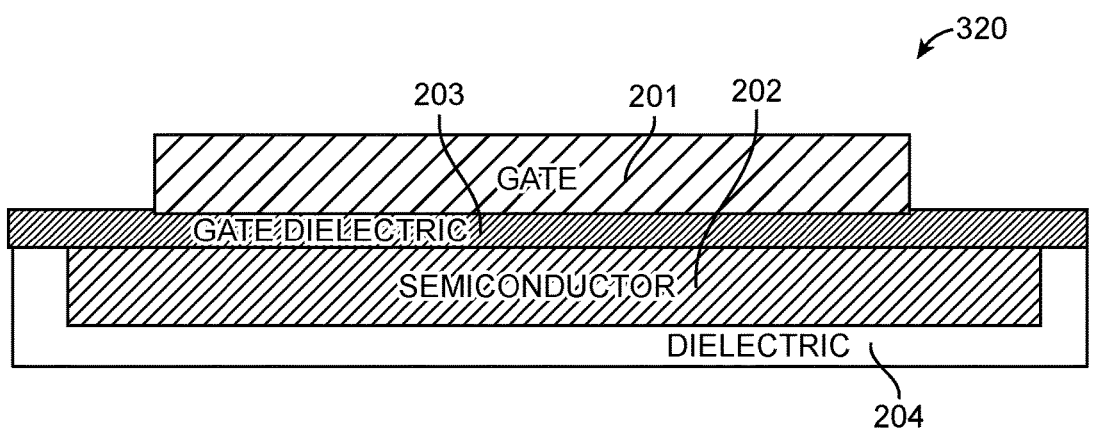
FIG. 7 illustrates an example planar region 320 including a gate 201, in accordance with an embodiment.

FIG. 7 illustrates an example planar region 320 including a gate 201, in accordance with an embodiment. In one embodiment, the spacer 103 in the planar region is removed, and a thin dielectric layer is applied to form a separate planar-specific gate dielectric 203 for the planar region. The gate dielectric 203 may be formed, for example, by thermal nitridation or plasma nitridation. In another embodiment, the spacer 103 in the planar region is masked instead, and re-used as a gate dielectric 203 for the planar region.

As stated above, uniformed masking and etching strategy are used to create vertical and planar gates. Gate metals are deposited, and the gate 201 is etched using the same gate mask as the vertical gate 101 to produce the planar region 320.

Dielectric is deposited on the fin 102F, and the dielectric is etched to expose one or more portions of the fin 102F (e.g., a top of the fin 102F). Epitaxial crystal growth during epitaxial deposition is only limited to epitaxial crystal growth on the exposed portions of the fin 102F. Therefore, epitaxy is formed from vertical and/or lateral epitaxial crystal growth on exposed portions of the fin 102F after epitaxial deposition. In one embodiment, epitaxial preclean is performed before epitaxial deposition to prepare the exposed portions of the fin 102F for epitaxial crystal growth. Dielectric deposition and planarizing are next performed.

Top and bottom S/D contact openings are masked and etched. Silicide is formed in the S/D regions. For example, as shown in FIGS. 1 and 3, silicide regions 108A, 108B, 208A and 208B may be formed in the S/D regions. Contact metal is deposited in the silicide regions to form contacts. The contacts are planarized (i.e., to make flat).

Figure 8:
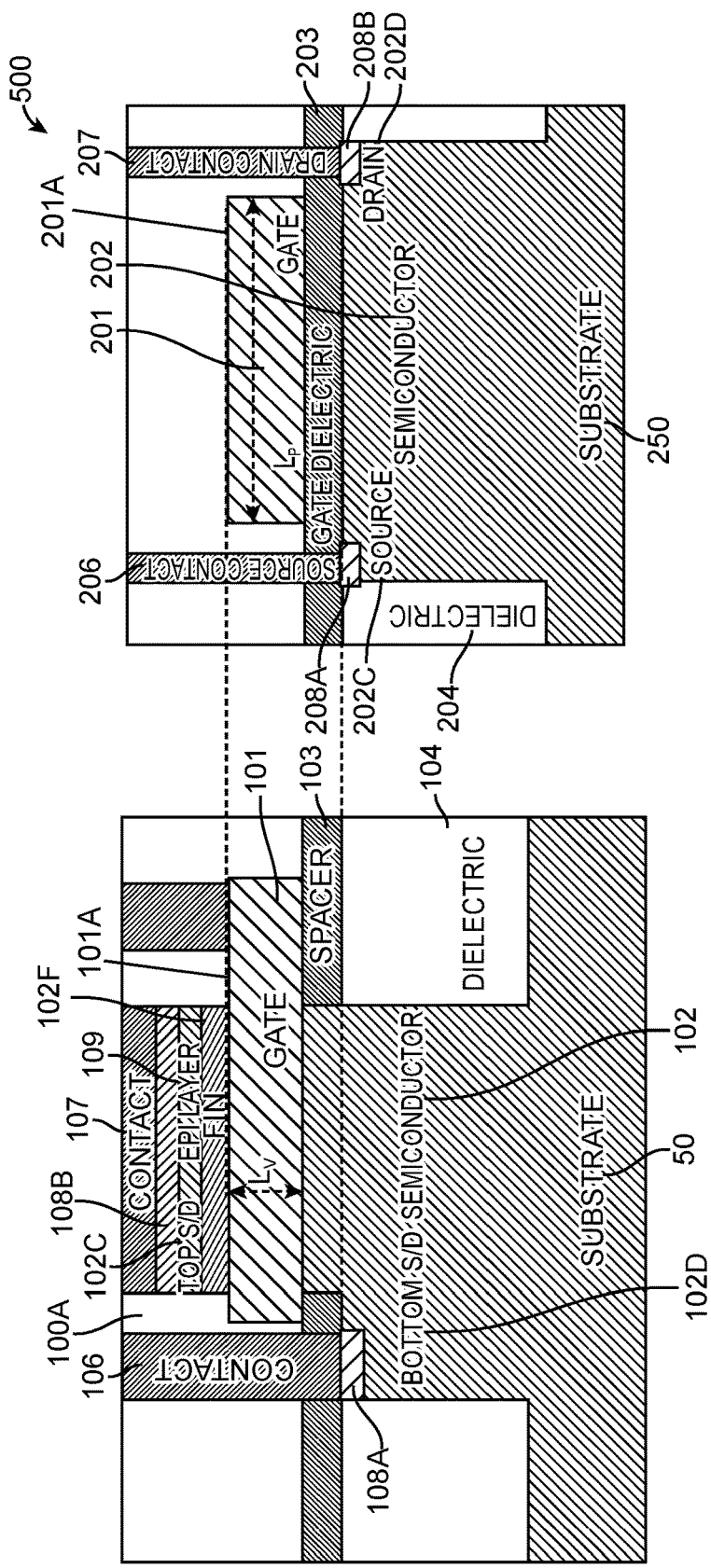
FIG. 8 illustrates a semiconductor 500 comprising a vertical FET structure 100 with a planar FET structure 200, in accordance with an embodiment.

FIG. 8 illustrates a semiconductor 500 comprising a vertical FET structure 100 with a planar FET structure 200, in accordance with an embodiment. As shown in FIG. 8, a gate top 101A of the gate 101 for the vertical region is co-planar with a gate top 201A of the gate 201 for the planar region.

Figure 9:
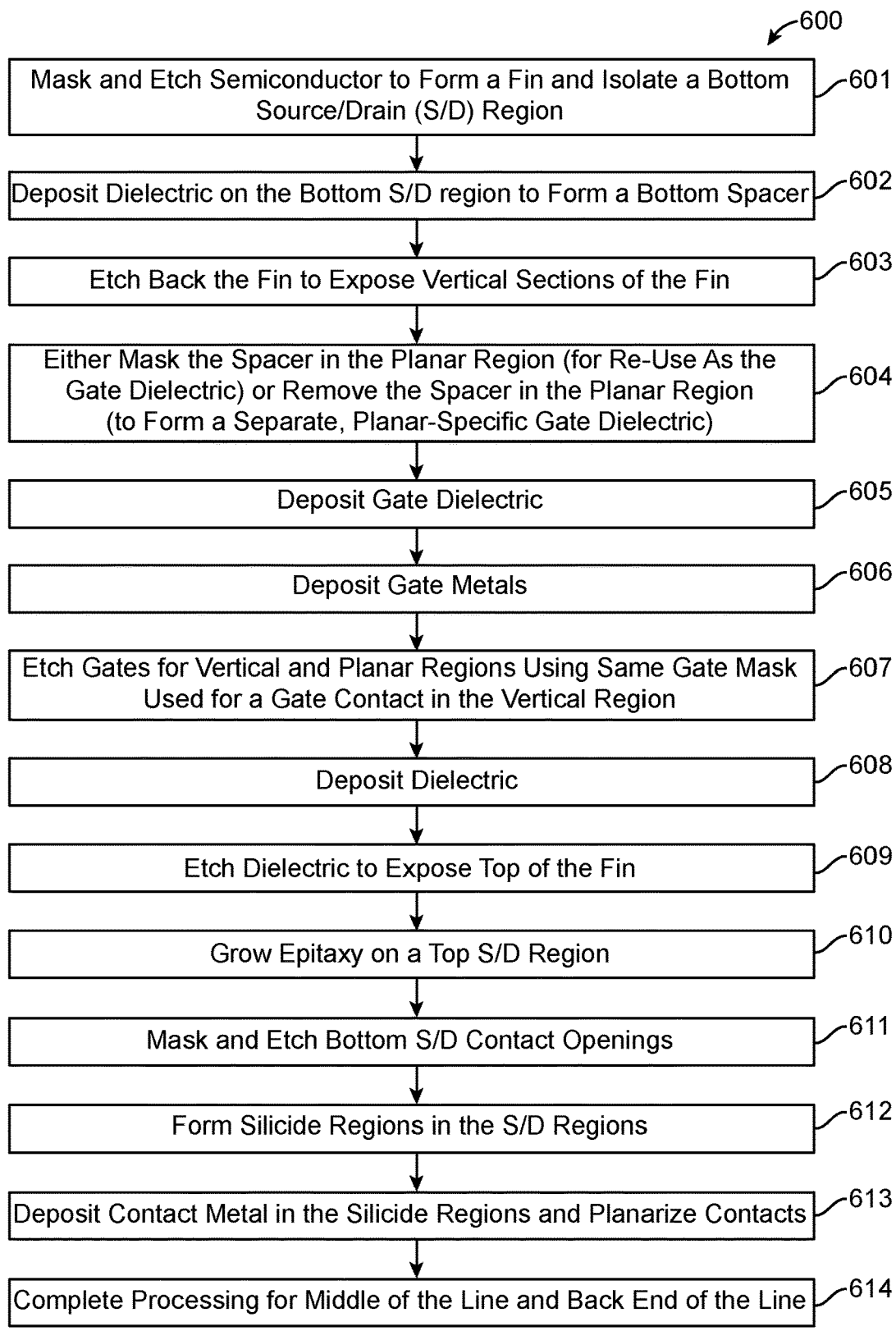
FIG. 9 illustrates an example flowchart 600 for integrating a planar FET with a vertical FET, in accordance with an embodiment.

In one embodiment, the bottom S/D region 102D for the vertical region is co-planar with the semiconductor 202 for the planar region FIG. 9 illustrates an example flowchart 600 for integrating a planar FET with a vertical FET, in accordance with an embodiment. In process block 601, mask and etch semiconductor to form a fin and isolate a bottom S/D region. In process block 602, deposit dielectric on the bottom S/D region to form a bottom spacer. In process block 603, etch back the fin to expose vertical sections of the fin. In process block 604, either mask the spacer in the planar region (for re-use as the gate dielectric) or remove the spacer in the planar region (to form a separate, planar-specific gate dielectric). In process block 605, deposit gate dielectric. In process block 606, deposit gate metals. In process block 607, etch gates for vertical and planar regions using same gate mask used for a gate contact in the vertical region (i.e., the vertical and planar regions share a vertical and planar gate mask required for the gate contact during the RIE process for the spacer).

In process block 608, deposit dielectric. In process block 609, etch dielectric to expose top of fin. In process block 610, grow epitaxy on a top S/D region (e.g., vertical and/or lateral epitaxial growth on exposed portions of the fin). In process block 611, mask and etch bottom S/D contact openings. In process block 612, form silicide regions in S/D regions. In process block 613, deposit contact metal in silicide regions and planarize contacts (i.e., make contacts flat). In process blow 614, complete processing for middle of the line and back end of the line.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   manufacturing a semiconductor structure comprising a planar field-effect transistor (FET) and a vertical FET by integrating the planar FET into the vertical FET, wherein the integrating comprises:
   masking a spacer in a planar region of the planar FET;
   re-using the spacer as a gate dielectric for the planar region;
   depositing gate metals; and
   etching a vertical gate for a vertical region of the vertical FET and a planar gate for the planar region from the gate metals using a shared gate mask, wherein a top of the vertical gate and a top of the planar gate are co-planar.

2. The method of claim 1, wherein the gate metals are deposited on a first semiconductor of the vertical FET and a second semiconductor of the planar FET.

3. The method of claim 2, wherein the integrating further comprises:
   masking and etching the first semiconductor of the vertical FET to form a fin;
   providing additional masking, additional etching, doping and depositions to isolate a bottom source/drain (S/D) region of the vertical FET;

depositing spacer dielectric on the bottom S/D region to form the spacer; and etching back the fin to expose one or more vertical sections of the fin.

4. The method of claim 3, wherein the vertical gate of the vertical FET is perpendicular to and extends across the first semiconductor of the vertical FET.

5. The method of claim 3, wherein the planar gate of the planar FET is perpendicular to and extends across the second semiconductor of the planar FET.

6. The method of claim 3, wherein the integrating further comprises:

implanting the bottom S/D region in a first portion and a second portion of the vertical FET and the planar FET, respectively, such that the first portion and the second portion share the bottom S/D region.

7. The method of claim 6, wherein the bottom S/D region is co-planar with an active region of the planar FET.

8. The method of claim 3, wherein the integrating further comprises:

forming the spacer using a reactive ion etching (RIE) process, wherein a gate contact for the vertical gate is masked using the shared gate mask during the RIE process.

* * * * *